(12) United States Patent
Chen et al.

(10) Patent No.: US 10,510,585 B2
(45) Date of Patent: *Dec. 17, 2019

(54) MULTI-PATTERNING TO FORM VIAS WITH STRAIGHT PROFILES

(71) Applicant: Taiwan Semiconductor Manufacturing Company, Ltd., Hsinchu (TW)

(72) Inventors: Chun-Kai Chen, Kaohsiung (TW); Jung-Hau Shiu, New Taipei (TW); Chia Cheng Chou, Keelung (TW); Chung-Chi Ko, Nantou (TW); Tze-Liang Lee, Hsinchu (TW); Chih-Hao Chen, Hsinchu (TW); Shing-Chyang Pan, Jhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/596,671

(22) Filed: May 16, 2017

(65) Prior Publication Data

US 2018/0033685 A1 Feb. 1, 2018

Related U.S. Application Data

(62) Division of application No. 15/223,572, filed on Jul. 29, 2016, now Pat. No. 9,679,804.

(51) Int. Cl.
*H01L 21/768* (2006.01)

(52) U.S. Cl.
CPC .... *H01L 21/76813* (2013.01); *H01L 21/7681* (2013.01); *H01L 21/76829* (2013.01)

(58) Field of Classification Search
USPC .......................................... 438/618
See application file for complete search history.

(56) References Cited

U.S. PATENT DOCUMENTS 6,576,980 B1 * 6/2003 Shao ................. C23C 16/30
257/632
9,355,893 B1 5/2016 Chen et al.
(Continued)

FOREIGN PATENT DOCUMENTS

| CN | 103871959 A | 6/2014 |
| TW | 200945491 A | 11/2009 |
| TW | 105810632 A | 7/2016 |

*Primary Examiner* — Timor Karimy
(74) *Attorney, Agent, or Firm* — Slater Matsil, LLP

(57) ABSTRACT

A method includes forming a carbon-containing layer with a carbon atomic percentage greater than about 25 percent over a first hard mask layer, forming a capping layer over the carbon-containing layer, forming a first photo resist over the capping layer, and etching the capping layer and the carbon-containing layer using the first photo resist as a first etching mask. The first photo resist is then removed. A second photo resist is formed over the capping layer. The capping layer and the carbon-containing layer are etched using the second photo resist as a second etching mask. The second photo resist is removed. A third photo resist under the carbon-containing layer is etched using the carbon-containing layer as etching mask. A dielectric layer underlying the third photo resist is etched to form via openings using the third photo resist as etching mask. The via openings are filled with a conductive material.

20 Claims, 18 Drawing Sheets

(56) References Cited

U.S. PATENT DOCUMENTS

| | | |
|---|---|---|
| 9,449,869 B2 | 9/2016 | Zhou |
| 9,679,804 B1 * | 6/2017 | Chen ................. H01L 21/76813 |
| 2007/0111373 A1 | 5/2007 | Ueda |
| 2007/0111514 A1 | 5/2007 | Chen et al. |
| 2007/0281470 A1 | 12/2007 | Takasaki |
| 2008/0280433 A1 | 11/2008 | Iba |
| 2009/0191706 A1 | 7/2009 | Kubota |
| 2010/0035402 A1 * | 2/2010 | Hirota ............... H01L 21/76816 |
| | | 438/393 |
| 2011/0254165 A1 | 10/2011 | Muranaka |
| 2012/0068356 A1 * | 3/2012 | Ahles ................. B81C 1/00095 |
| | | 257/774 |
| 2014/0199837 A1 * | 7/2014 | Hung ............... H01L 21/76816 |
| | | 438/675 |

\* cited by examiner

MULTI-PATTERNING TO FORM VIAS WITH STRAIGHT PROFILES

PRIORITY CLAIM AND CROSS-REFERENCE

This application is a divisional of U.S. patent application Ser. No. 15/223,572 entitled "Multi-Patterning to Form Vias with Straight Profiles," filed on Jul. 29, 2016, which application is incorporated herein by reference.

BACKGROUND

In order to form integrated circuits on wafers, lithography process is used. A typical lithography process involves applying a photo resist, and defining patterns on the photo resist. The patterns in the patterned photo resist are defined in a lithography mask, and are defined either by the transparent portions or by the opaque portions in the lithography mask. The patterns in the patterned photo resist are then transferred to the underlying features through an etching step, wherein the patterned photo resist is used as an etching mask. After the etching step, the patterned photo resist is removed.

With the increasing down-scaling of integrated circuits, optical proximity effect posts an increasingly greater problem for transferring patterns from lithography mask to wafers. When two separate features are too close to each other, the optical proximity effect may cause the resulting formed features too short to each other. To solve such a problem, double-patterning technology was introduced for enhancing feature density without incurring optical proximity effect. One of the double patterning technologies uses two-patterning-two-etching (2P2E). The closely located features are separated into two lithography masks, with both lithography masks used to expose the same photo resist or two photo resists, so that the closed located patterns may be transferred to a same layer such as a low-k dielectric layer. In each of the double patterning lithography masks, the distances between the features are increased over the distances between the features in the otherwise single patterning mask, and may be practically doubled when necessary. The distances in the double patterning lithography masks are greater than the threshold distances of the optical proximity effect, and hence the optical proximity effect is at least reduced, or substantially eliminated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
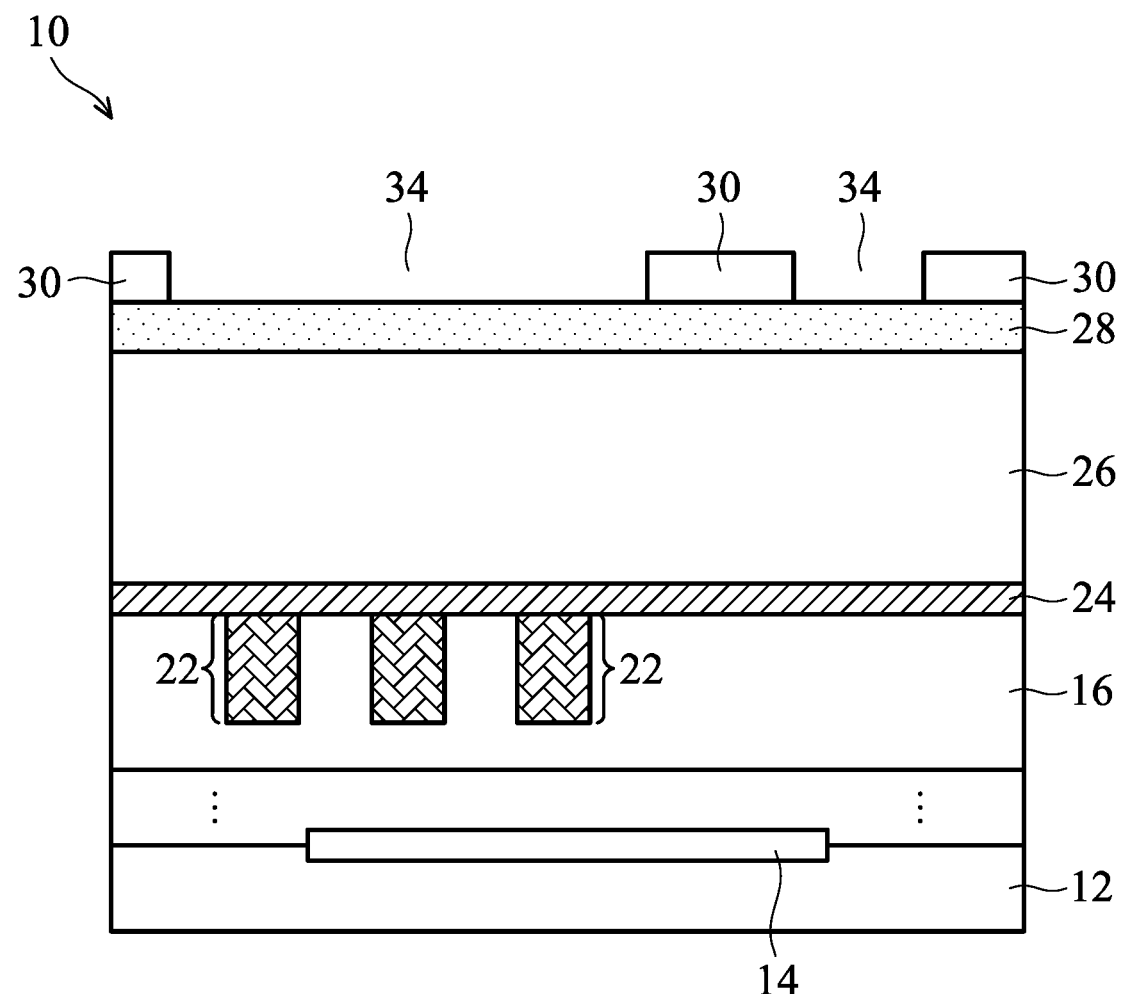
FIGS. 1 through 16 illustrate the cross-sectional views of intermediate stages in the formation of metal lines and the underlying vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A multiple patterning method for forming closely located vias in the interconnect structure of integrated circuits is provided in accordance with various exemplary embodiments. The intermediate stages of forming the vias are illustrated. Some variations of some embodiments are discussed. Throughout the various views and illustrative embodiments, like reference numbers are used to designate like elements.

Figure 18:
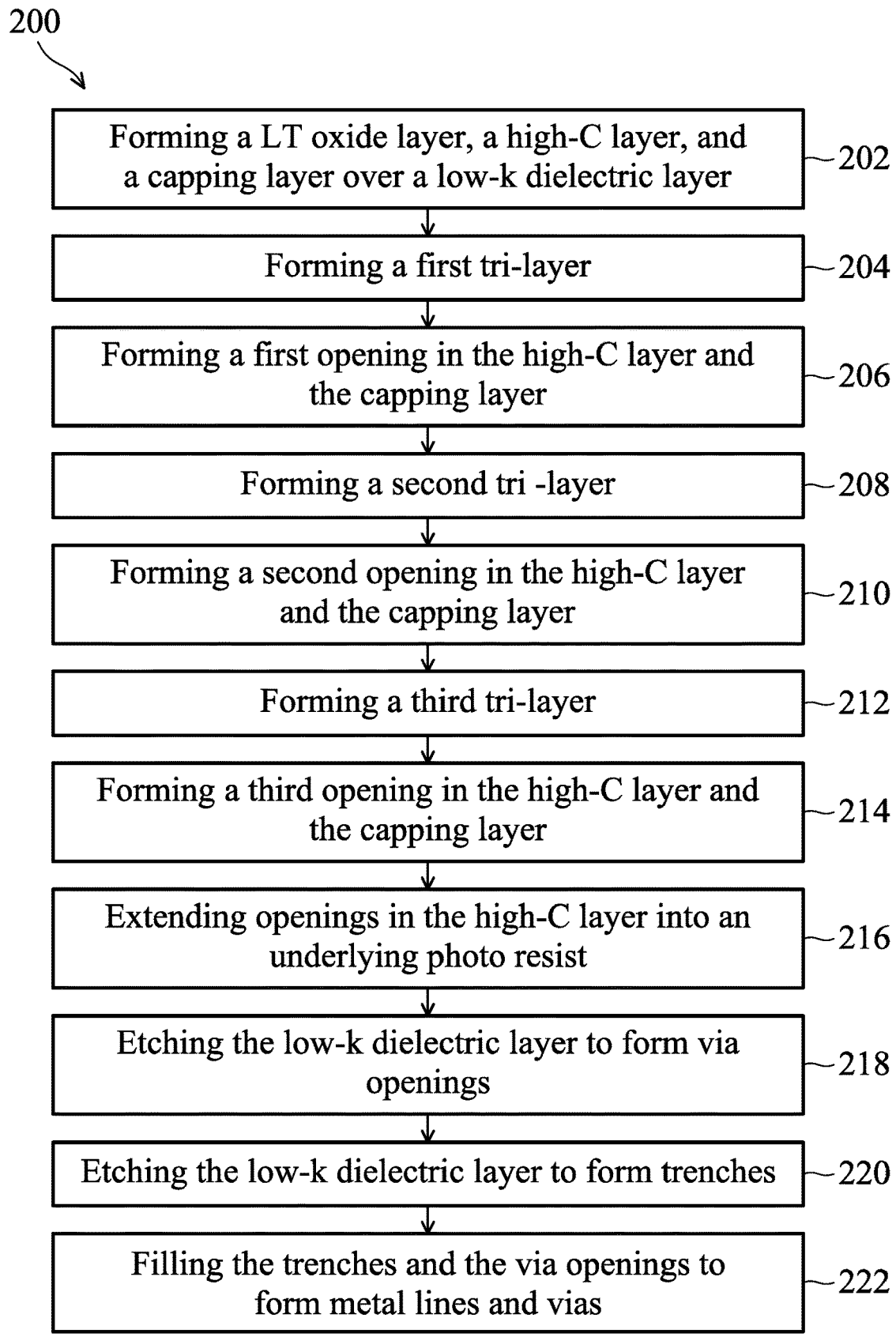
FIG. 18 illustrates a process flow for forming an integrated circuit structure including multiple vias underlying and connected to respective overlying metal line(s) in accordance with some embodiments.

FIGS. 1 through 16 illustrate the cross-sectional views of intermediate stages in the formation of vias in accordance with some embodiments. The steps shown in FIGS. 1 through 16 are also illustrated schematically in the process flow 200 shown in FIG. 18.

FIG. 1 illustrates a cross-sectional view of wafer 10, wherein the illustrated portion is a part of a device die. In accordance with some embodiments of the present disclosure, wafer 10 is a device wafer including active devices such as transistors and/or diodes, and possibly passive devices such as capacitors, inductors, resistors, and/or the like. In accordance with some embodiments of the present disclosure, wafer 10 includes semiconductor substrate 12 and the features formed at a top surface of semiconductor substrate 12. Semiconductor substrate 12 may be formed of silicon, germanium, silicon germanium, or a III-V compound semiconductor such as GaAsP, AlInAs, AlGaAs, GaInAs, GaInP, GaInAsP, or the like. Semiconductor substrate 12 may also be a bulk silicon substrate or a Silicon-On-Insulator (SOI) substrate. Shallow Trench Isolation (STI) regions (not shown) are formed in semiconductor substrate 12 to isolate the active regions in semiconductor substrate 12. Although not shown, through-substrate vias (sometimes referred to as through-silicon vias) may be formed to extend into semiconductor substrate 12, wherein the through-substrate vias are used to electrically inter-couple the features on opposite sides of wafer 10. Active devices 14, which may include transistors therein, are formed at the top surface of substrate 12.

Further illustrated in FIG. 1 is dielectric layer 16, which may be an Inter-Layer Dielectric (ILD) or an Inter-Metal Dielectric (IMD) layer. In accordance with some embodiments of the present disclosure, dielectric layer 16 is formed of a low-k dielectric material having a dielectric constant (k-value) lower than about 3.0, about 2.5, or even lower. Dielectric layer 16 may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), MethylSilsesQuioxane (MSQ), or the like. In accordance with some embodiments of the present disclosure, the formation of dielectric layer 16 includes depositing a porogen-containing dielectric material and then performing a curing process to drive out the porogen, and hence the remaining dielectric layer 16 is porous.

Conductive features 22 are formed in dielectric layer 16. In accordance with some embodiments, conductive features 22 are metal lines, with each including a diffusion barrier layer (not shown) and a copper-containing region (not shown) over the diffusion barrier layer. The diffusion barrier layer may include titanium, titanium nitride, tantalum, tantalum nitride, or the like and have the function of preventing the copper in conductive features 22 from diffusing into dielectric layer 16. Conductive features 22 may also be contact plugs or metal vias in accordance with some embodiments. Conductive features 22 may have a single damascene structure or a dual damascene structure.

Dielectric layer 24 is formed over dielectric layer 16 and conductive features 22. Dielectric layer 24 may be used as an Etch Stop Layer (ESL), and hence is referred to as ESL 24 throughout the description. ESL 24 may be formed of a nitride, a silicon-carbon based material, a carbon-doped oxide, and/or combinations thereof. The formation methods include Plasma Enhanced Chemical Vapor Deposition (PECVD) or other methods such as High-Density Plasma CVD (HDPCVD), Atomic Layer Deposition (ALD), and the like. In accordance with some embodiments, dielectric layer 24 is also used as a diffusion barrier layer for preventing undesirable elements, such as copper, from diffusing into the subsequently formed low-k dielectric layer. ESL 24 may include Carbon-Doped Oxide (CDO), carbon-incorporated silicon oxide (SiOC) or oxygen-Doped Carbide (ODC). ESL 24 may also be formed of Nitrogen-Doped silicon Carbide (NDC). ESL 24 may be a single layer or may include more than one layer.

Dielectric layer 26 is formed over ESL 24. In accordance with some exemplary embodiments of the present disclosure, dielectric layer 26 is formed of a low-k dielectric material, and is referred to as low-k dielectric layer 26 hereinafter. Low-k dielectric layer 26 may be formed using a material selected from the same group of candidate materials for forming dielectric layer 16. When selected from the same group of candidate materials, the materials of dielectric layers 16 and 26 may be the same or different from each other. In accordance with some embodiments, dielectric layer 26 is a silicon and carbon containing low-k dielectric layer.

In accordance with some embodiments, layers 28 and 30 are formed over low-k dielectric layer 26. Layer 28 may be an Anti-Reflective coating Layer (ARL). ARL 28 may be formed of SiOC in accordance with some embodiments. ARL 28 may also be a Nitrogen-Free ARL (NFARL), which may be formed of an oxide in accordance with some exemplary embodiments. For example, NFARL may include silicon oxide formed using PECVD.

Mask layer 30 is formed over ARL 28. Mask layer 30 is also referred to as hard mask layer 30 hereinafter. In accordance with some embodiments of the present disclosure, hard mask layer 30 includes a metal(s), which may be in the form of a metal nitride such as titanium nitride (TiN). Hard mask layer 30 may also be formed of a non-metal nitride such as silicon nitride, an oxynitride such as silicon oxynitride, or the like.

Mask layer 30 is patterned to from trenches 34. In accordance with some embodiments of the present disclosure, trenches 34 are formed using a one-patterning-one-etching (1P1E) process. In accordance with alternative embodiments, trenches 34 are formed using a two-patterning-two-etching (2P2E) process, wherein two neighboring trenches 34 are formed in different lithography processes, so that neighboring trenches 34 may be located close to each other without incurring optical proximity effect.

Figure 2:
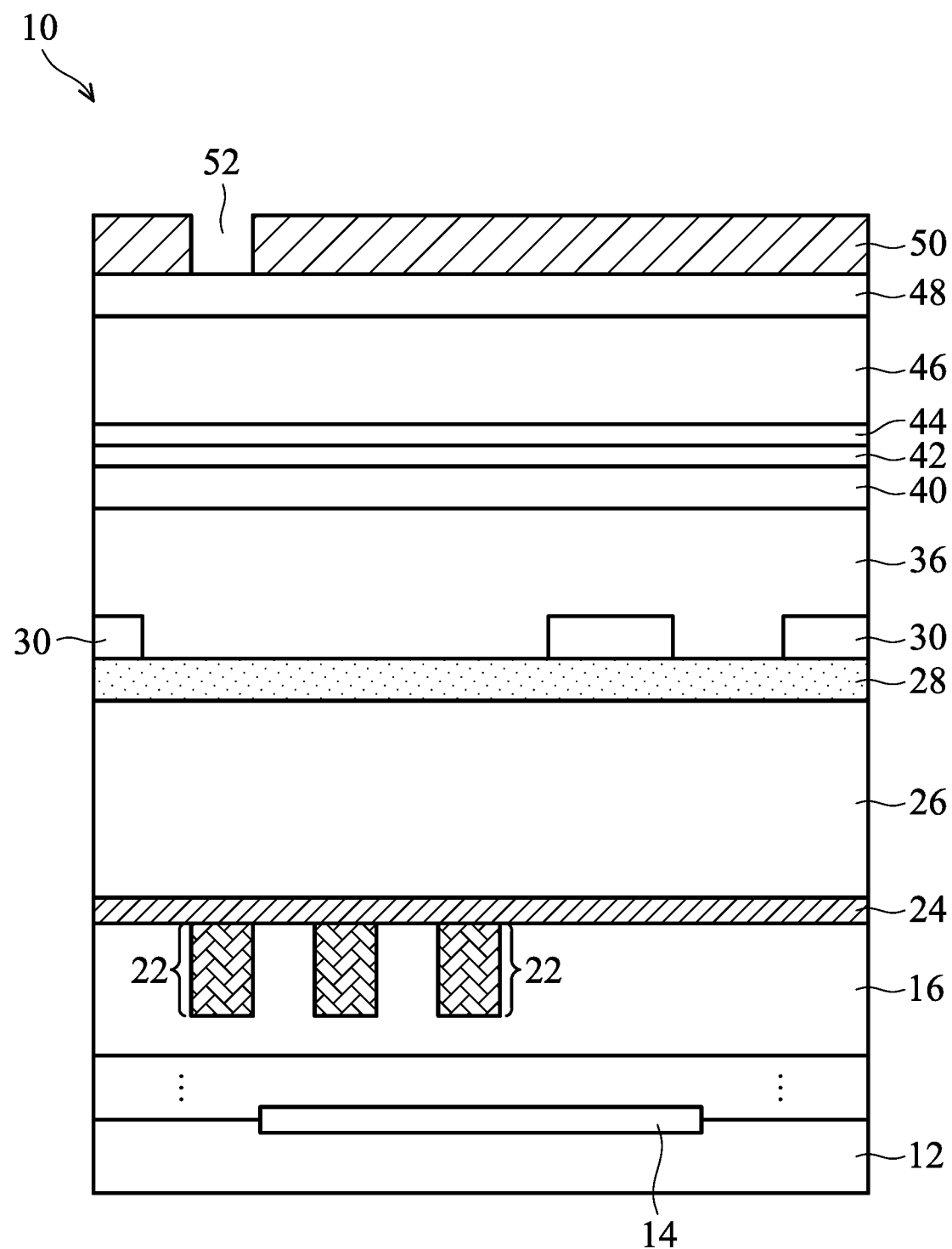

Referring to FIG. 2, photo resist 36 is formed over mask layer 30, and has some portions filled into trenches 34 (FIG. 1). Photo resist 36 may have a planar top surface, so that the subsequently formed layers overlying photo resist 36 may be planar layers, and may be very thin (for example, with thicknesses of several hundred angstroms) while still being conformal.

Next, layers 40, 42, and 44 are formed. The respective step is shown as step 202 in the process flow shown in FIG. 18. In accordance with some embodiments of the present disclosure, layer 40 is a Low-Temperature (LT) oxide layer, which is deposited at a low temperature, for example, lower than about 100° C. LT oxide layer 40 may be formed using ALD in accordance with some embodiments. Using ALD to form LT oxide layer 40 advantageously minimizes the damage to the underlying photo resist 36, which damage is caused by plasma, while other methods such as Chemical Vapor Deposition (CVD), Physical Vapor Deposition (PVD), or the like may also be used.

High-carbon layer 42 is formed over LT oxide layer 40. High-carbon layer 42 includes carbon and one or more of the elements including silicon, oxygen, and/or hydrogen. In accordance with some embodiments, high-carbon layer 42 includes Si-C bonds and Si-$CH_3$ bonds, and may be an organic layer or an inorganic layer. The carbon atomic percentage in high-carbon layer 42 may be greater than about 25 percent (hence the name "high-carbon layer" or "high-C layer"), and may be greater than about 30 percent. In accordance with some embodiments of the present disclosure, the carbon atomic percentage in high-carbon layer 42 is between about 25 percent and about 35 percent, the oxygen atomic percentage in high-carbon layer 42 is between about 30 percent and about 35 percent, and the silicon atomic percentage in high-carbon layer 42 is between about 35 percent and about 45 percent. The hydrogen atomic percentage in high-carbon layer 42 may be between about 0.5 percent and about 5 percent.

Capping layer 44 is formed over high-carbon layer 42. Capping layer 44 is formed using a material that has a high-resistance to the gas used in ashing photo resist, wherein the ashing gas may include oxygen ($O_2$), ozone ($O_3$), or the like. In accordance with some embodiments, capping layer 44 is a silicon oxide layer.

A tri-layer is formed over capping layer 44, which tri-layer includes bottom layer (also known as under layer) 46, middle layer 48 over bottom layer 46, and upper layer 50 over middle layer 48. The respective step is shown as step 204 in the process flow shown in FIG. 18. In accordance with some embodiments, bottom layer 46 and upper layer 50 are formed of photo resists. Middle layer 48 may be formed of an inorganic material, which may be a carbide (such as silicon oxycarbide), a nitride (such as silicon nitride), an oxynitride (such as silicon oxynitride), an oxide (such as silicon oxide), or the like. For example, when formed of carbide, middle layer 48 may include SiOC, which is a low-carbon layer having a carbon percentage lower than the carbon atomic percentage of high-carbon layer 42. In accordance with some embodiments, the low-carbon layer 48 has a carbon atomic percentage lower than about 15 percent, or around 12 percent. Middle layer 48 has a high etching selectivity with relative to upper layer 50 and bottom layer 46, and hence upper layer 50 may be used as an etching mask for patterning middle layer 48, and middle layer 48 may be used as an etching mask for patterning bottom layer 46. Upper layer 50 is patterned to form opening 52, which has the pattern of via 80A (FIG. 16), which is to be formed in low-k dielectric layer 26 in subsequent steps.

Figure 3:
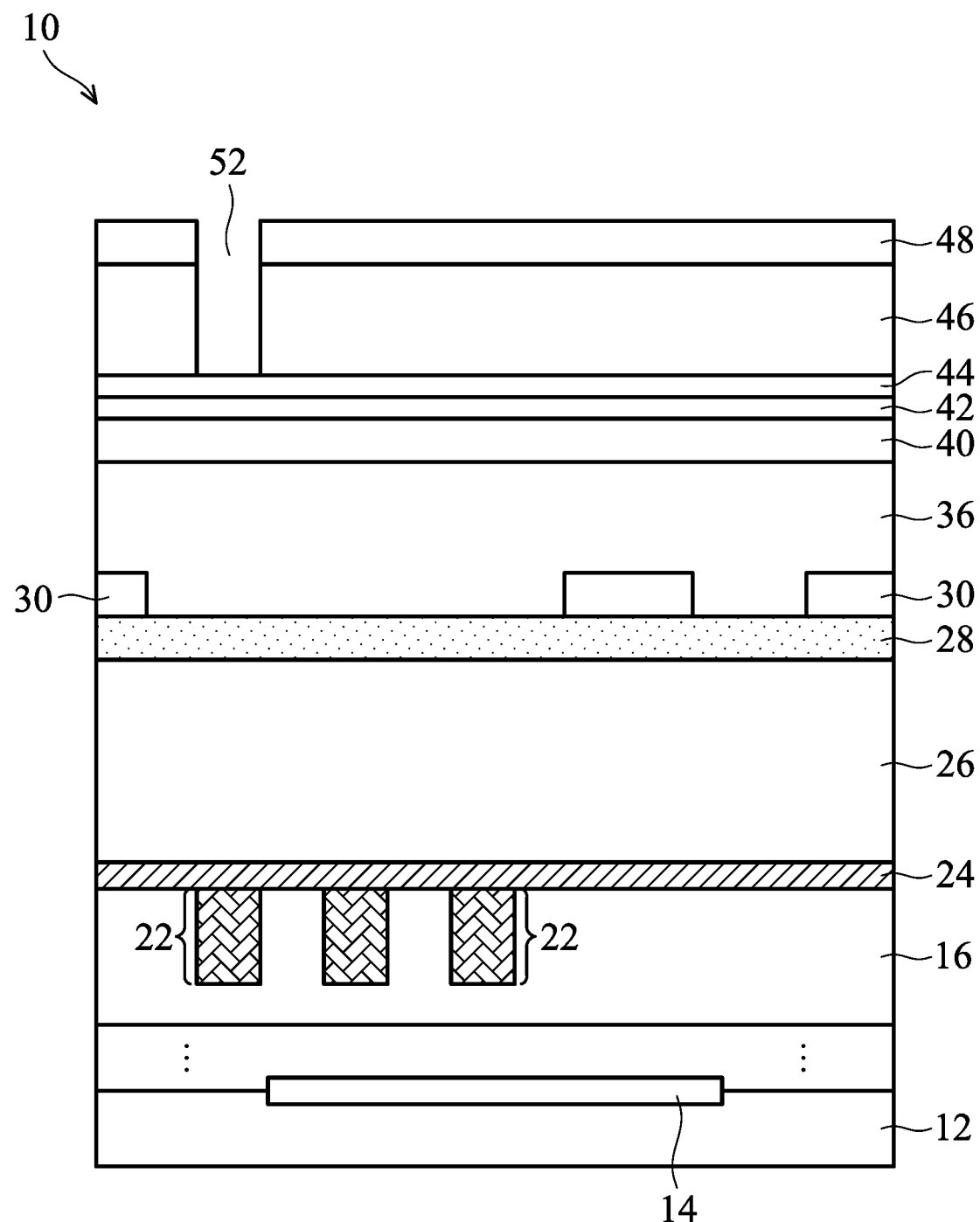

Next, referring to FIG. 3, middle layer 48 is etched using the patterned upper layer 50 (FIG. 2) as an etching mask, so that the pattern of upper layer 50 is transferred to middle layer 48. During the patterning of middle layer 48, upper layer 50 is at least partially, or entirely, consumed. After middle layer 48 is etched through, bottom layer 46 is patterned, wherein middle layer 48 is used as an etching mask. Upper layer 50 will also be fully consumed during the patterning of bottom layer 46 if it has not been fully consumed in the patterning of middle layer 48.

Figure 4:
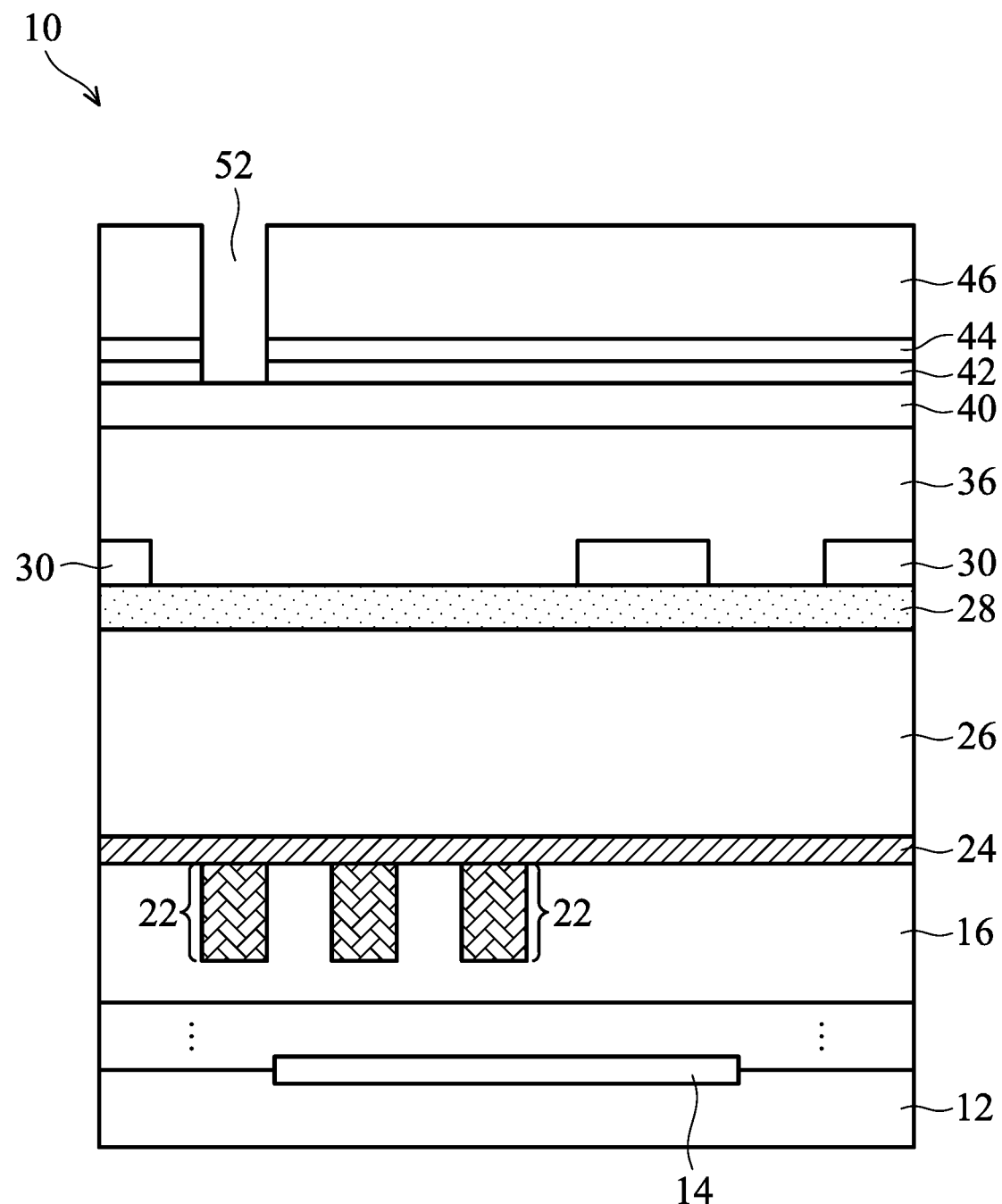

Bottom layer 46 and the overlying middle layer 48 are then used as an etching mask to etch the underlying layers 44 and 42, which etching process is referred to as a first etching process. The respective step is shown as step 206 in the process flow shown in FIG. 18. The resulting structure is shown in FIG. 4. Opening 52 thus extends into layer 42, with layer 40 exposed to opening 52. Since middle layer 48 and layer 44 are both formed of inorganic materials, and may have a low etching selectivity with relative to each other, middle layer 48 (FIG. 3) may be consumed, and bottom layer 46 acts as the etching mask in the subsequent etching of layers 44 and 42. During the patterning of layers 44 and 42, bottom layer 46 is also consumed, although at a lower etching rate than middle layer 48 and layers 44 and 42. Hence, at the time the patterning of layers 44 and 42 is finished, the thickness of bottom layer 46 is reduced.

Figure 5:
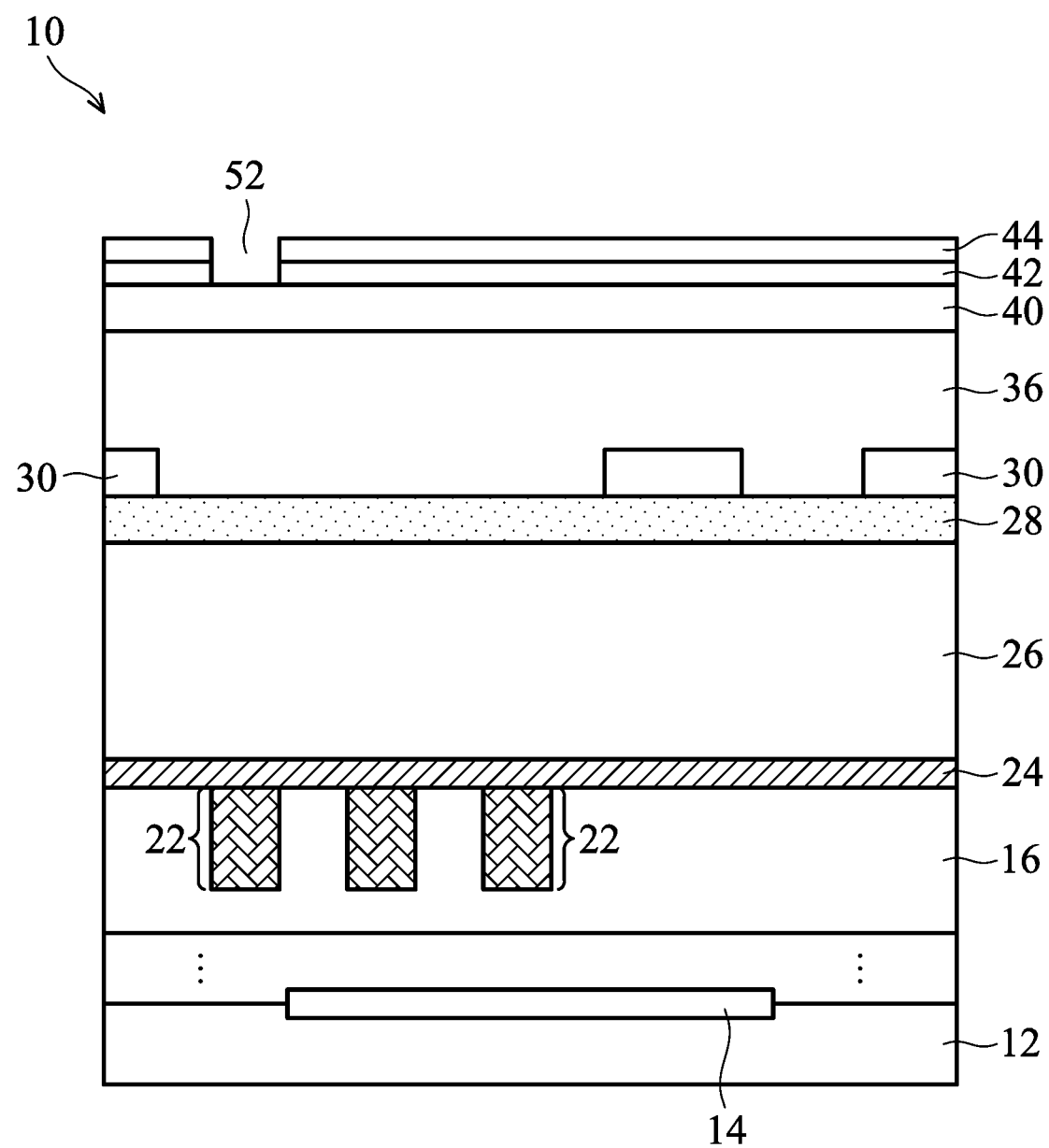

After the etching, the remaining bottom layer 46, which comprises photo resist, is removed in an ashing process, wherein oxygen plasma (such as $O_2$ plasma or $O_3$ plasma) is used to remove bottom layer 46. The resulting structure is shown in FIG. 5.

The ashing process, which is performed using oxygen plasma, has the tendency of causing the carbon in carbon-containing dielectric layer to lose, for example, forming carbon oxide that is evacuated out of the respective process chamber. This causes the resulting carbon-containing dielectric layer to have lowered carbon content. If the carbon in layer 40 is lost in the ashing, the resulting material, which includes mainly silicon and oxygen, will be similar to the material of the underlying LT oxide layer 40 in composition. As a result, the etching selectivity between layers 42 and 40 will be undesirably reduced if carbon is lost. This is disadvantageous since layer 42 will be used as an etching mask to etch LT oxide layer 40, and hence it is desirable to have a high etching selectivity between layer 42 and 40. Advantageously, in the embodiments of the present disclosure, with the ashing-resistant capping layer 44 covering and protecting high-carbon layer 42, the carbon percentage in high-carbon layer 42 remains substantially constant throughout multiple ashing processes, and the etching selectivity between layers 42 and 40 remain unchanged throughout multiple ashing processes.

Figure 6:
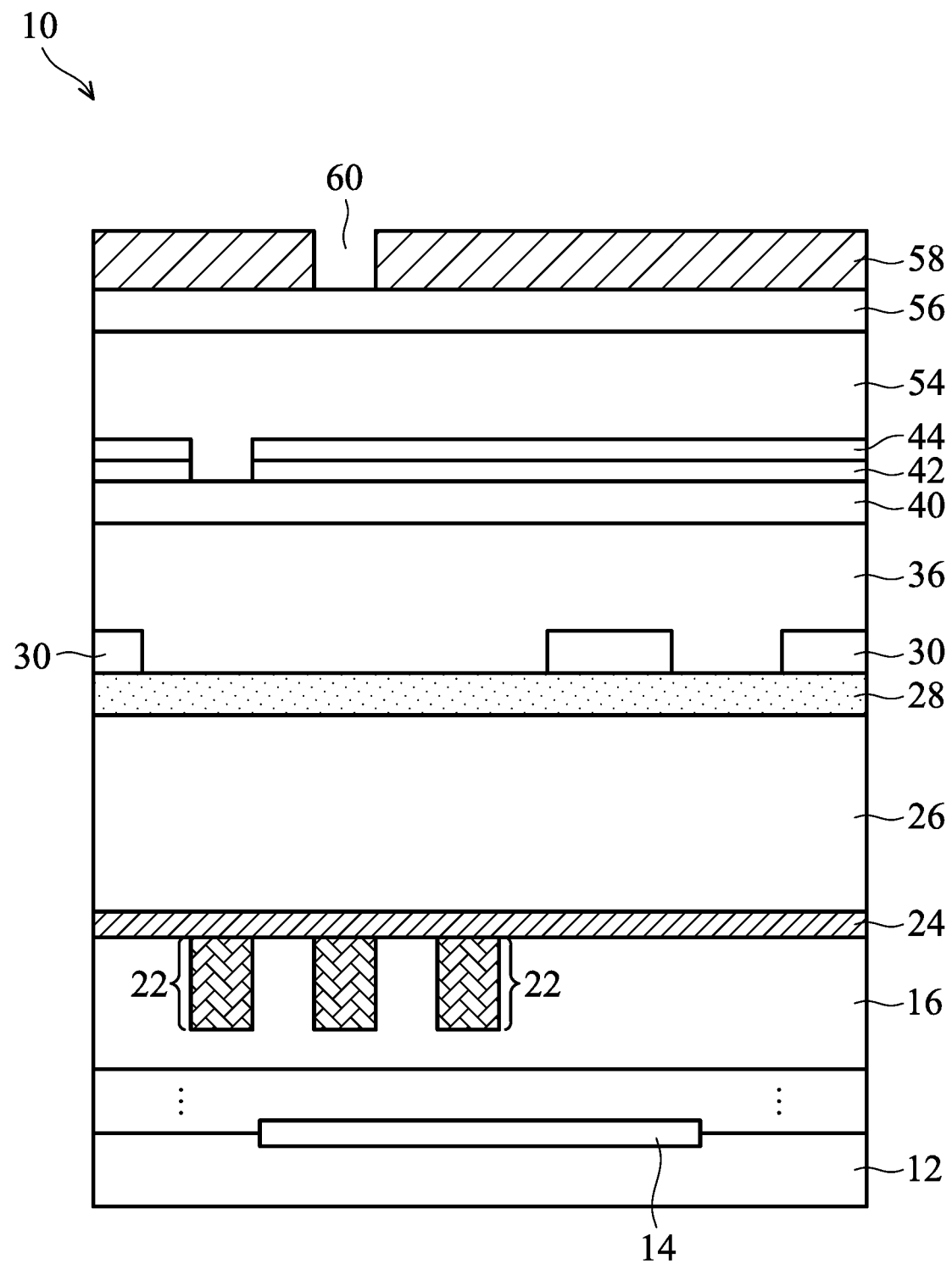
Figure 8:
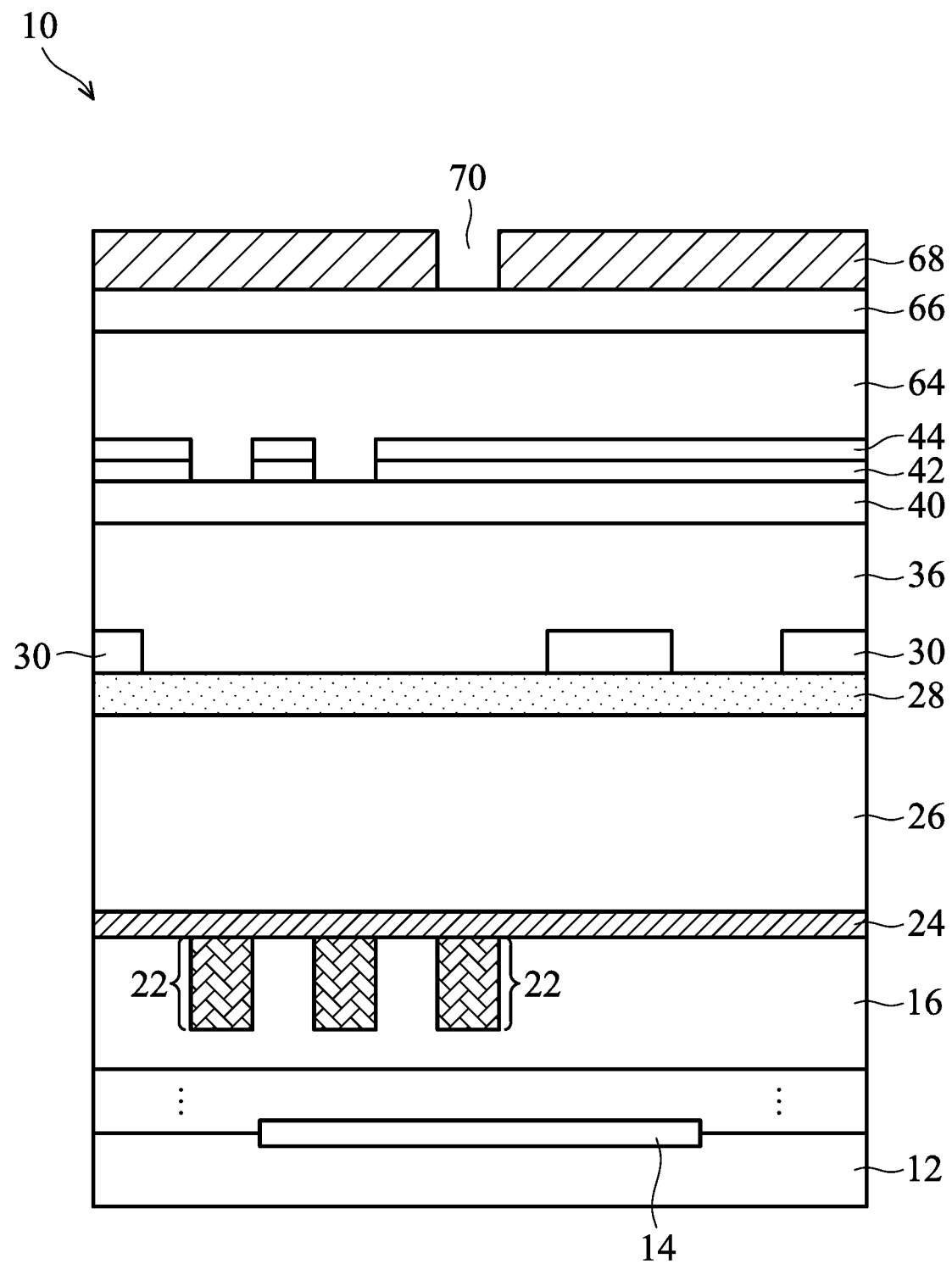

FIGS. 6 and 8 illustrate a second-photo-second-etching process in the patterning of layers 44 and 42. In accordance with some embodiments of the present disclosure, as shown in FIG. 6, a second tri-layer is formed over layer 44. The second tri-layer includes bottom layer 54, middle layer 56 over bottom layer 54, and upper layer 58 over middle layer 56. The respective step is shown as step 208 in the process flow shown in FIG. 18. In accordance with some embodiments, bottom layer 54 and upper layer 58 are formed of photo resists. Middle layer 56 may be formed of an inorganic material, which may be a carbide (such as silicon oxycarbide), a nitride (such as silicon nitride), an oxynitride (such as silicon oxynitride), an oxide (such as silicon oxide), or the like. Middle layer 56 has a high etching selectivity with relative to upper layer 58 and bottom layer 54, and hence upper layer 58 may be used as an etching mask for patterning middle layer 56, and middle layer 56 may be used as an etching mask for patterning bottom layer 54. Upper layer 58 is patterned to form opening 60.

Figure 7:
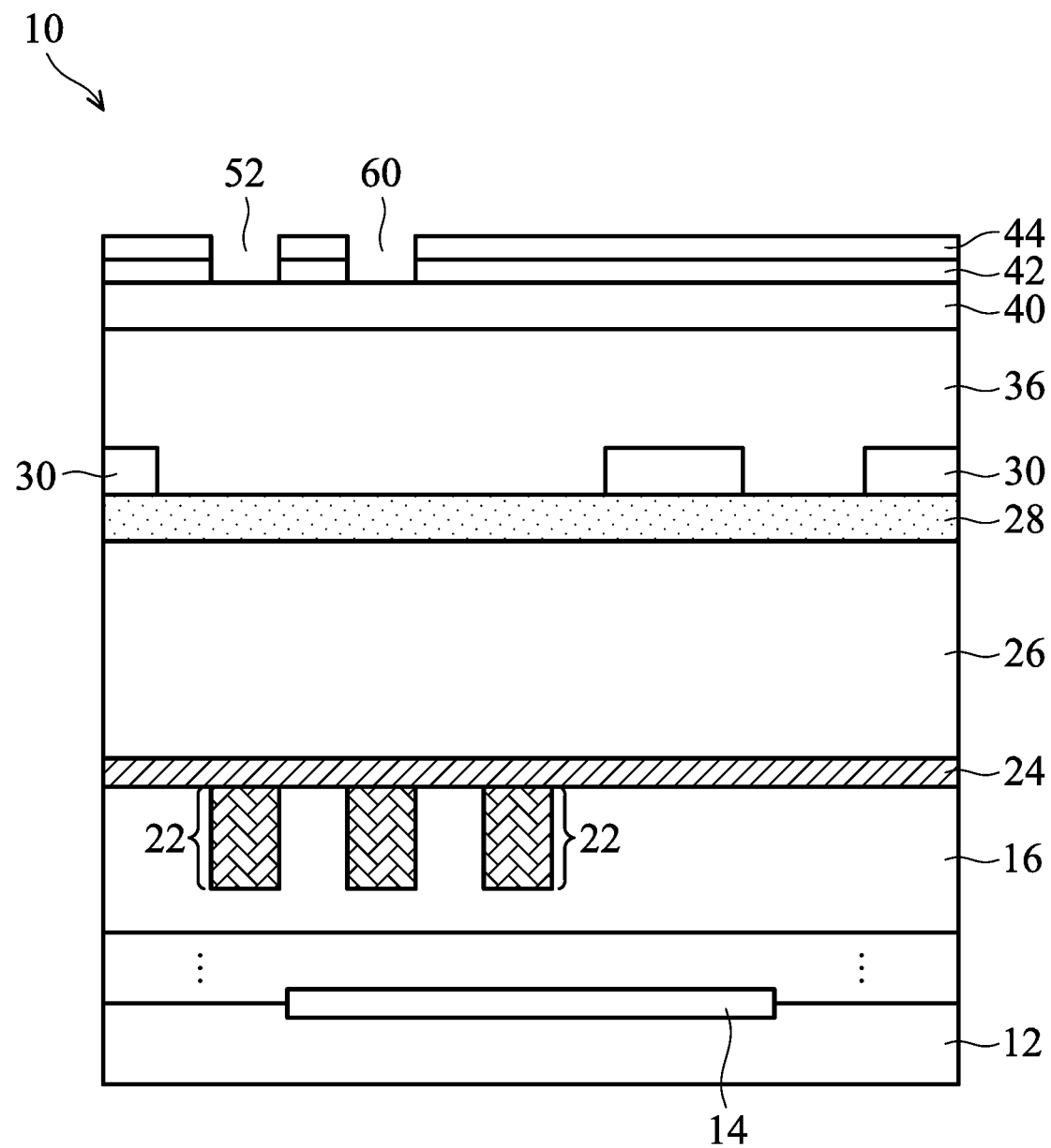

Middle layer 56 is then etched using the patterned upper layer 58 as an etching mask, so that the pattern of upper layer 58 is transferred into middle layer 56. During the patterning of middle layer 56, upper layer 58 may also be consumed. After middle layer 56 is etched through, bottom layer 54 is patterned, followed by the etching of layer 44. Opening 60 thus extends into layers 44 and 42, with layer 40 exposed to opening 60. The respective step is shown as step 210 in the process flow shown in FIG. 18. After the etching, the remaining bottom layer 54 (FIG. 6), which comprises photo resist, is removed in an ashing process, wherein oxygen plasma (generated from $O_2$ or $O_3$) is used to remove bottom layer 54. The resulting structure is shown in FIG. 7. As shown in FIG. 7, high-carbon layer 42 is protected by capping layer 44, and hence is not damaged in the ashing process.

Figure 9:
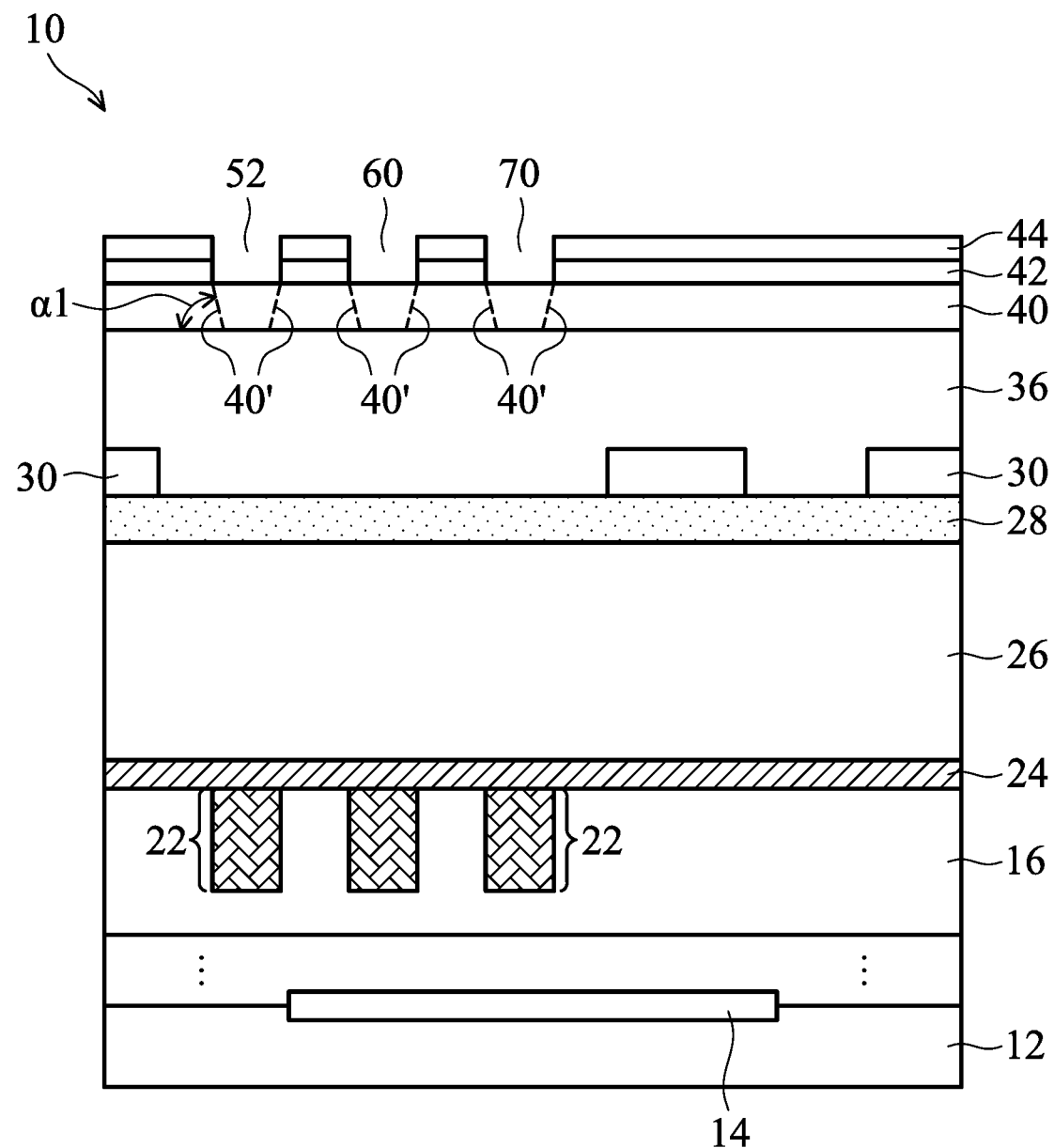

FIGS. 8 and 9 illustrate a third-photo-third-etching process in the patterning of layers 44 and 42. In accordance with some embodiments of the present disclosure, as shown in FIG. 8, a third tri-layer is formed over layer 44. The third tri-layer includes bottom layer 64, middle layer 66 over bottom layer 64, and upper layer 68 over middle layer 66. The respective step is shown as step 212 in the process flow shown in FIG. 18. Layers 64, 66, and 68 may be formed of similar materials as that of layers 54, 56, and 58, respectively.

Next, upper layer 68 is patterned to form opening 70, which also has the pattern of via 80C (FIG. 16) that is to be formed in low-k dielectric layer 26. Opening 70 is then extended into layers 44 and 42 in a plurality of etching processes, wherein the respective processes are similar to what are shown and discussed for FIGS. 6 and 7. The respective step is shown as step 214 in the process flow shown in FIG. 18. The resulting structure is shown in FIG. 9, wherein layers 44 and 42 have openings 52, 60, and 70 formed in different patterning-and-etching processes. Again, in these processes, capping layer 44 prevents the underlying high-carbon layer 42 from losing carbon in the ashing of under layer 64 (FIG. 8).

In subsequent processes, a plurality of etching processes are performed to extending openings 52, 60, and 70 into photo resist 36. The respective step is shown as step 216 in the process flow shown in FIG. 18. In accordance with some embodiments of the present disclosure, high-carbon layer 42 is used as an etching mask to etch LT oxide layer 40. Capping layer 44 is quickly consumed since its material may be similar to that of LT oxide layer 40, for example, with both being silicon oxide layers. Advantageously, since the carbon percentage in high-carbon layer 42 is maintained high in the preceding multiple patterning-and-etching processes, the etching selectivity between layers 42 and 40 is high, and hence the resulting LT oxide layer 40 has vertical edges. In addition, since capping layer 44 protects high-carbon layer 42 from losing carbon, the openings that are formed earlier (such as opening 52) are not enlarged, and have essentially the same lateral dimensions as the openings that are formed later (such as opening 70). Accordingly, the openings throughout wafer 10 have a uniform lateral dimension regardless of when the openings are formed.

Figure 17:
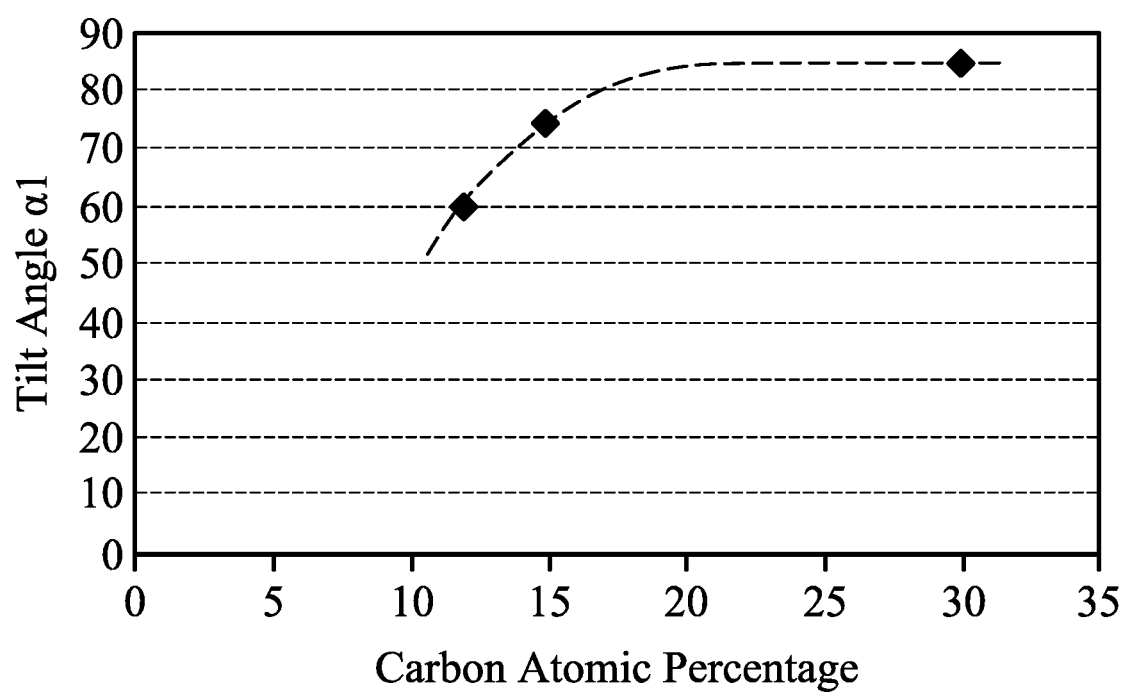
FIG. 17 illustrates experiment results reflecting the relationship between carbon percentages in a carbon-containing layer and tilt angles of vias in accordance with some embodiments.

Further referring to FIG. 9, dashed lines 40' are shown to represent the sidewalls of openings 52, 60, and 70 when the openings extend down into layer 40. Tilting angle $\alpha 1$ are the tilting angles of sidewalls 40'. FIG. 17 illustrates a graph illustrating the results of the experiments performed on silicon wafers having the structure shown in FIG. 9. In the experiments, openings 52, 60, and 70 are formed to stop on the top surface of photo resist 36, and 40' represent the sidewalls. FIG. 17 illustrates tilting angles $\alpha 1$ as a function of carbon atomic percentage in layer 42. FIG. 17 reveals that higher carbon atomic percentages cause the tilt angle $\alpha 1$ to be higher. For example, when the carbon atomic percent is about 12 percent, the tilt angle $\alpha 1$ is about 60 degrees. When the carbon atomic percent is increased to about 15 percent, the tilt angle $\alpha 1$ is about 74 degrees. When the carbon atomic percent is increased to about 28 percent, the tilt angle $\alpha 1$ is about 85 degrees. When the carbon atomic percent is increased to about 25 percent or higher, the increase in tilt angle $\alpha 1$ begins to saturate. Accordingly, the carbon atomic percent in layer 42 may be greater than about 25 percent, or greater about 30 percent to achieve desirable results.

Figure 10:
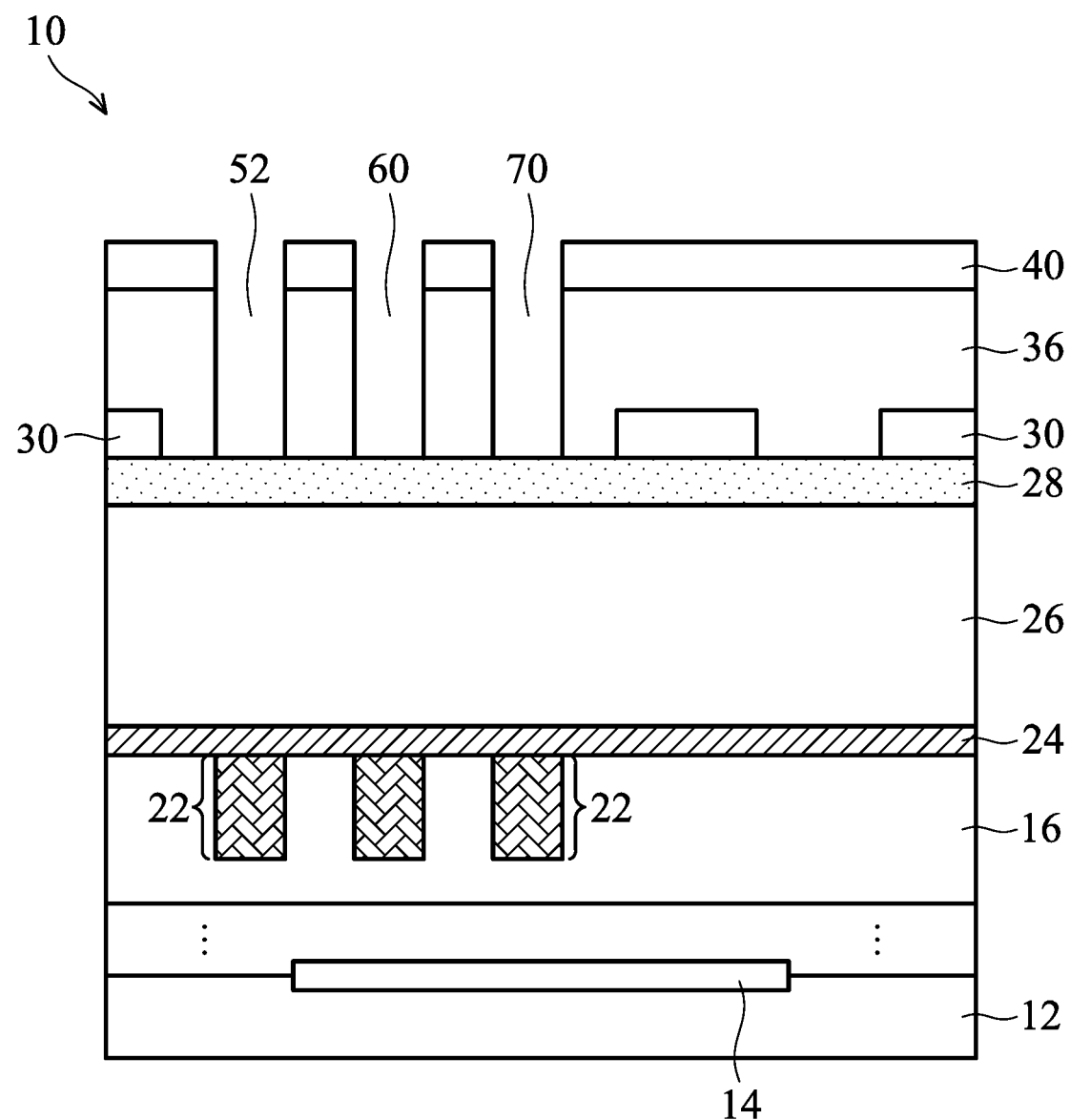

As shown in FIG. 10, openings 52, 60, and 70 are transferred into photo resist 36 in an anisotropic etching process, hence exposing ARL 28. Furthermore, openings 52, 60, and 70 are aligned to the openings (trenches) in mask layer 30.

Figure 11:
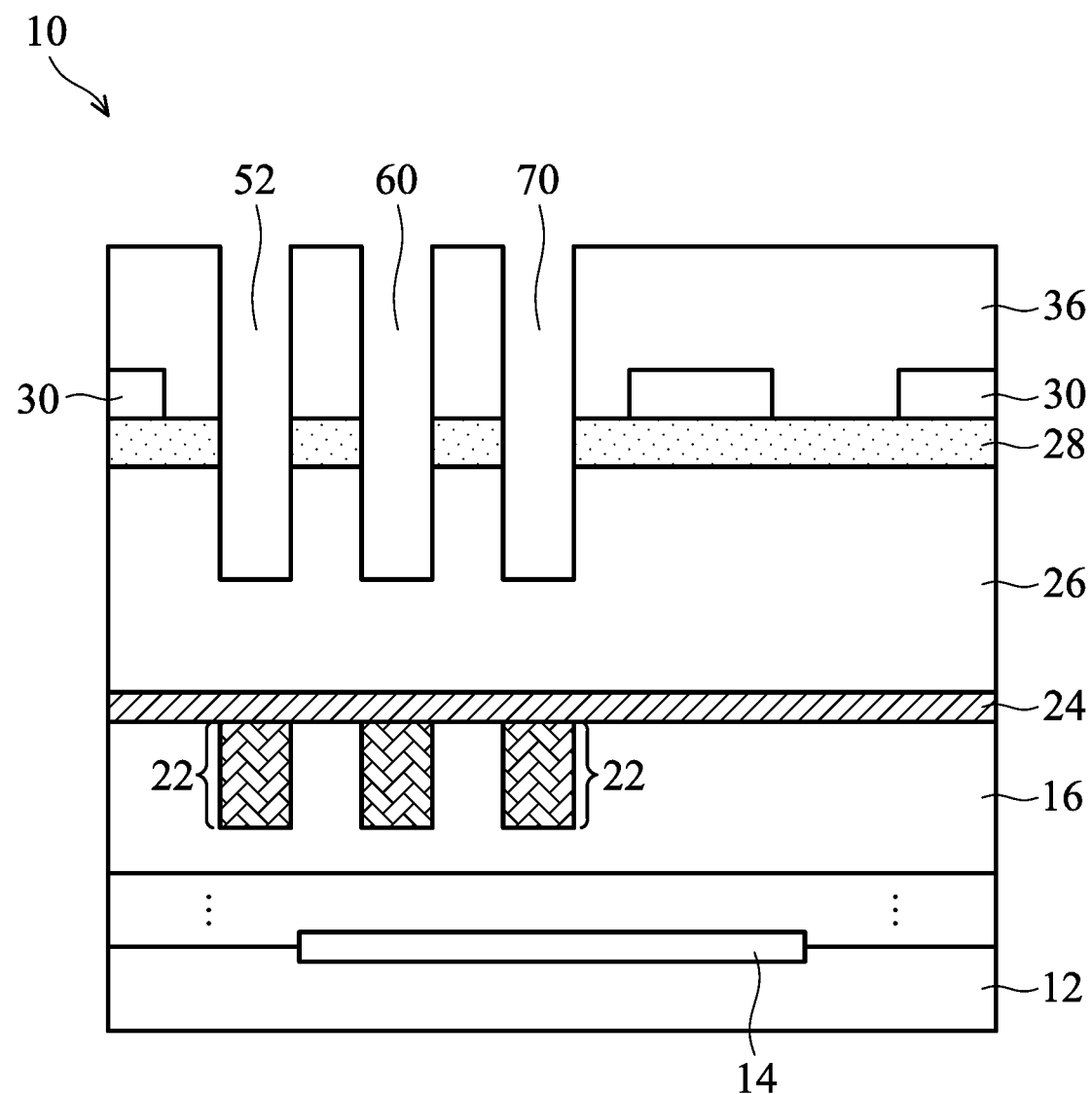
Figure 12:
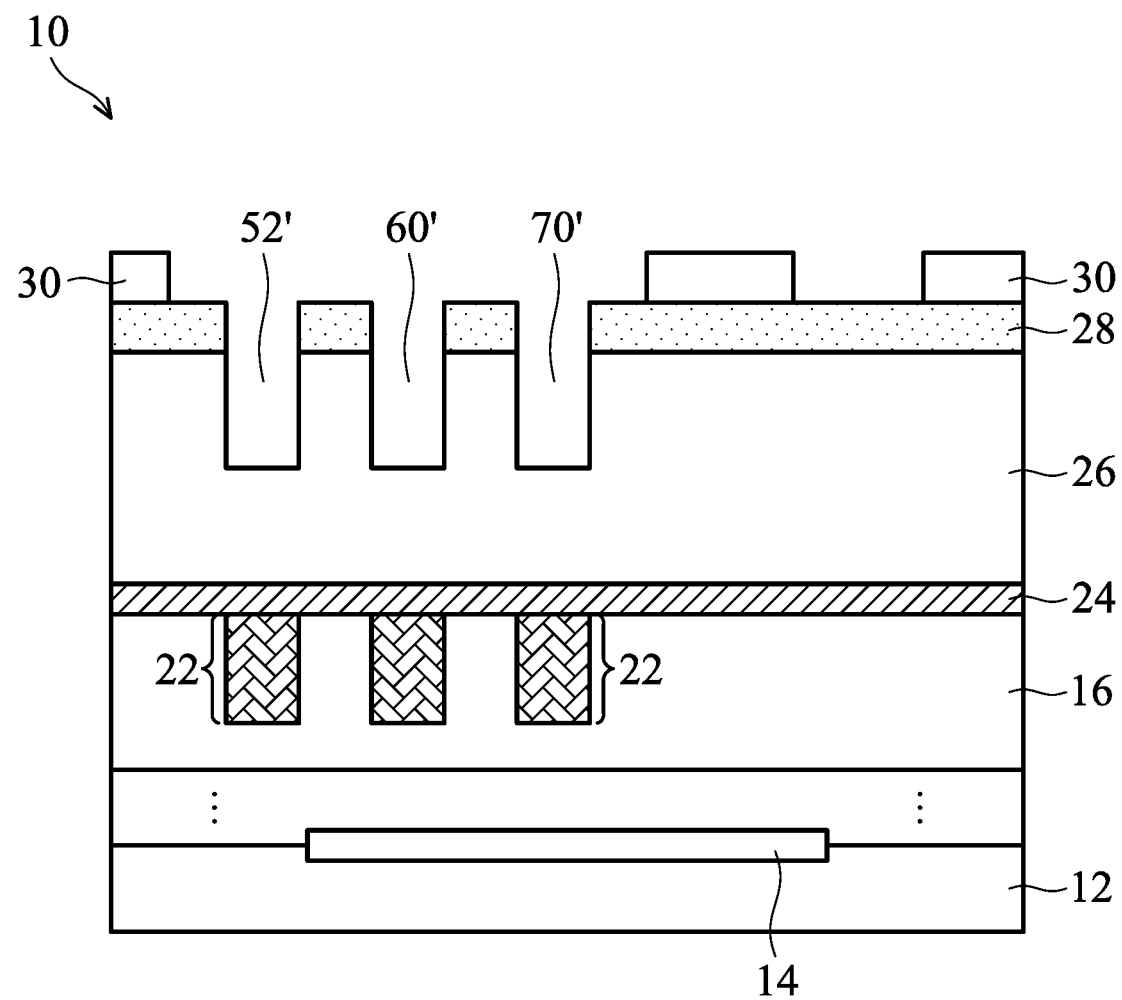

FIGS. 11 and 12 illustrate the transferring of via patterns 52, 60, and 70 into low-k dielectric layer 26. The respective step is shown as step 218 in the process flow shown in FIG. 18. Referring to FIG. 11, photo resist 36 is used as an etching mask to etch ARL 28 and low-k dielectric layer 26. In accordance with some embodiments of the present disclosure, photo resist 36 is removed after the etching, leaving patterned mask 30 exposed. In accordance with alternative embodiments, after the etching of low-k dielectric layer 26, some portions of photo resist 36 are left unremoved, as shown in FIG. 11. An ashing process is then performed to remove the remaining photo resist 36, for example, through the ashing using oxygen ($O_2$) plasma or ozone plasma. The resulting structure is shown in FIG. 12.

Referring to FIG. 12, mask layer 30 is exposed, and via openings are formed. In subsequent description, the via openings in low-k dielectric layer 26 are referred to as 52', 60', and 70', respectively. Via openings 52', 60', and 70' extend to an intermediate level of low-k dielectric layer 26.

Figure 13:
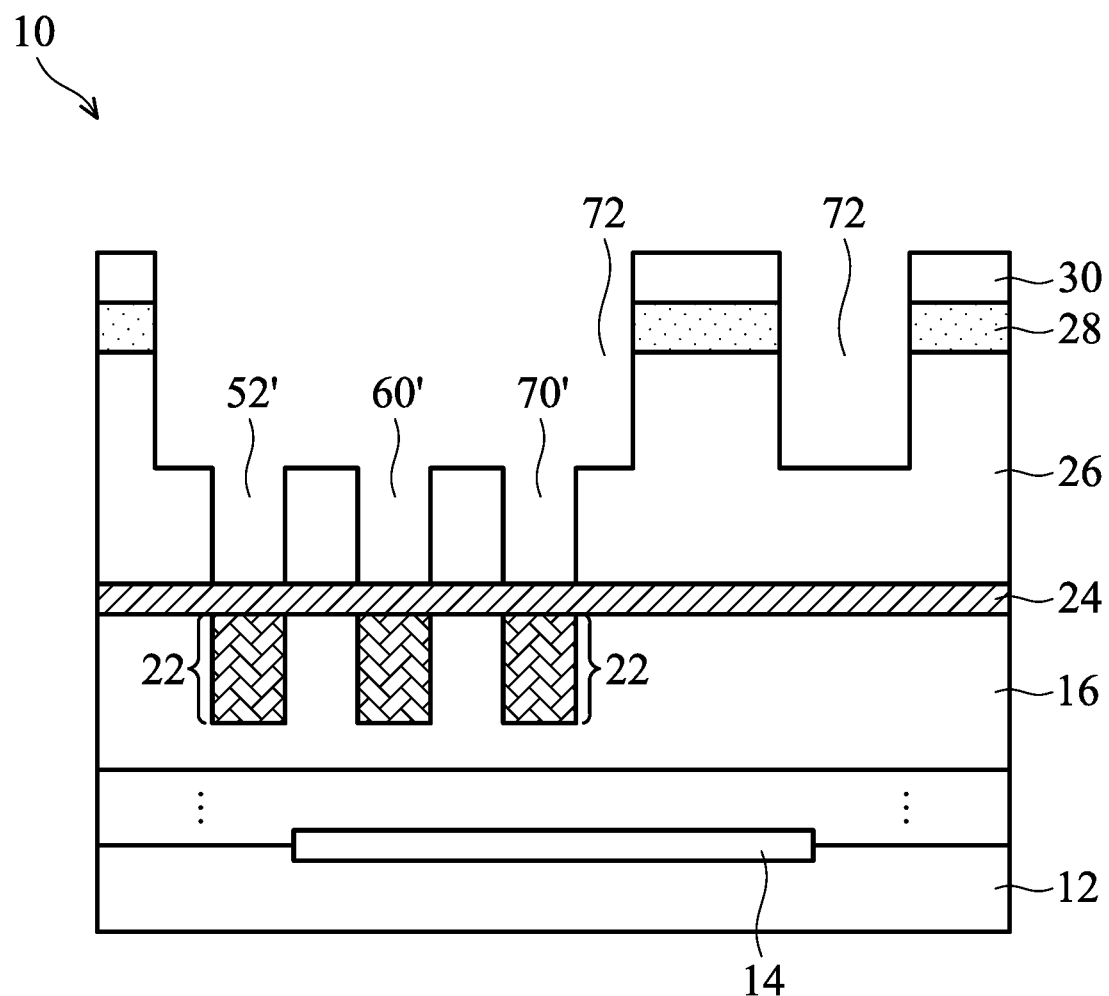

Next, as shown in FIG. 13, an anisotropic etching is performed to etch low-k dielectric layer 26, wherein mask layer 30 is used as the etching mask. Trenches 72 are thus formed. The respective step is shown as step 220 in the process flow shown in FIG. 18. During the anisotropic etching, via openings 52', 60', and 70' further extend down to the bottom of low-k dielectric layer 26, and ESL 24 is exposed. Trenches 72 have bottoms at an intermediate level between the top surface and the bottom surface of low-k dielectric layer 26.

Figure 14:
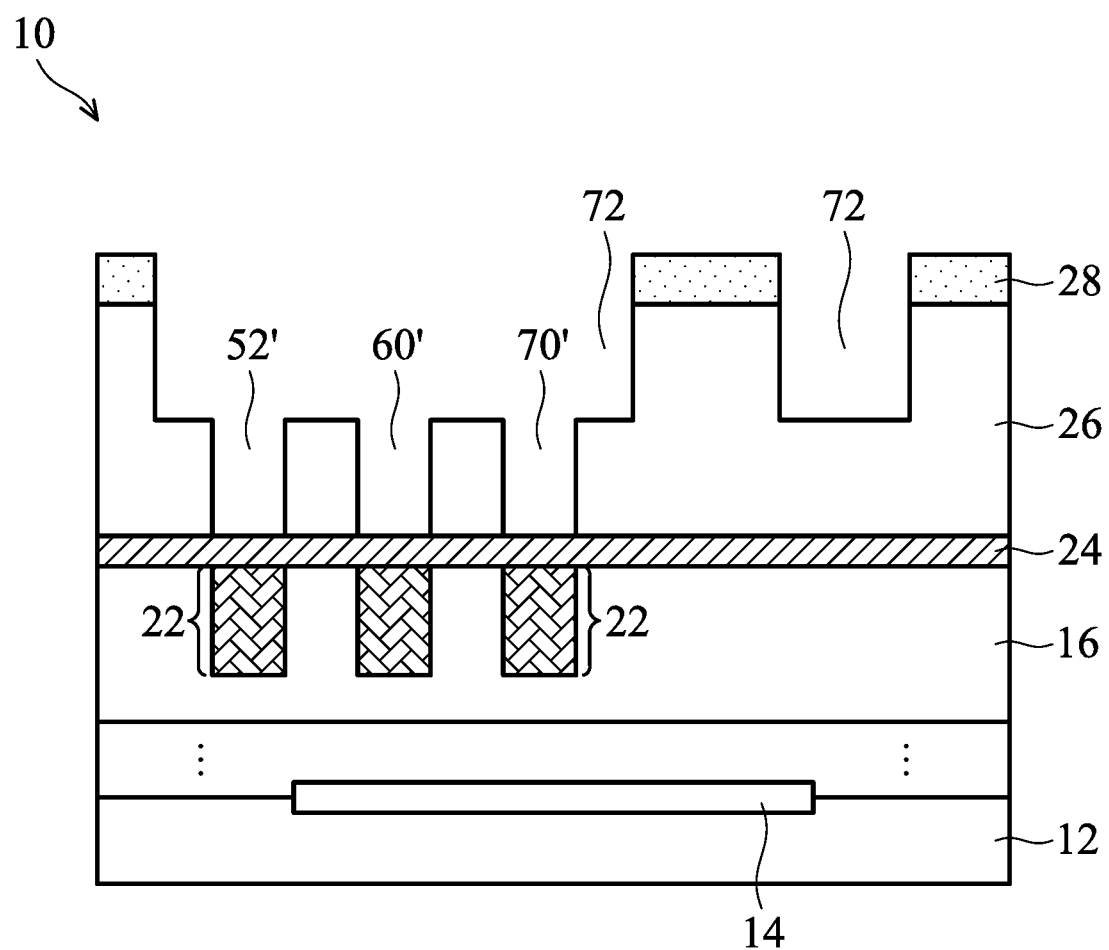
Figure 15:
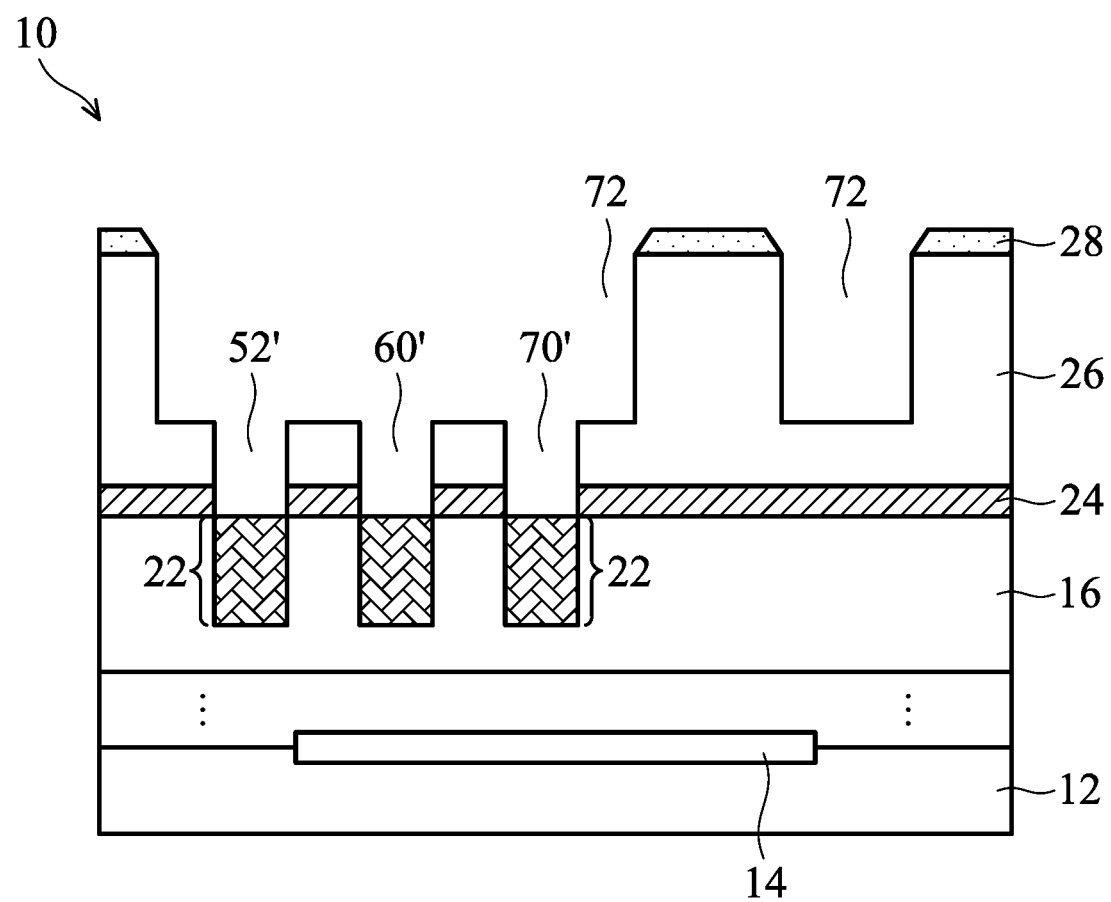

Next, mask layer 30 is removed, and the resulting structure is shown in FIG. 14. In a subsequent step, as shown in FIG. 15, etch stop layer ESL 24 is etched to expose the underlying metal features 22.

Figure 16:
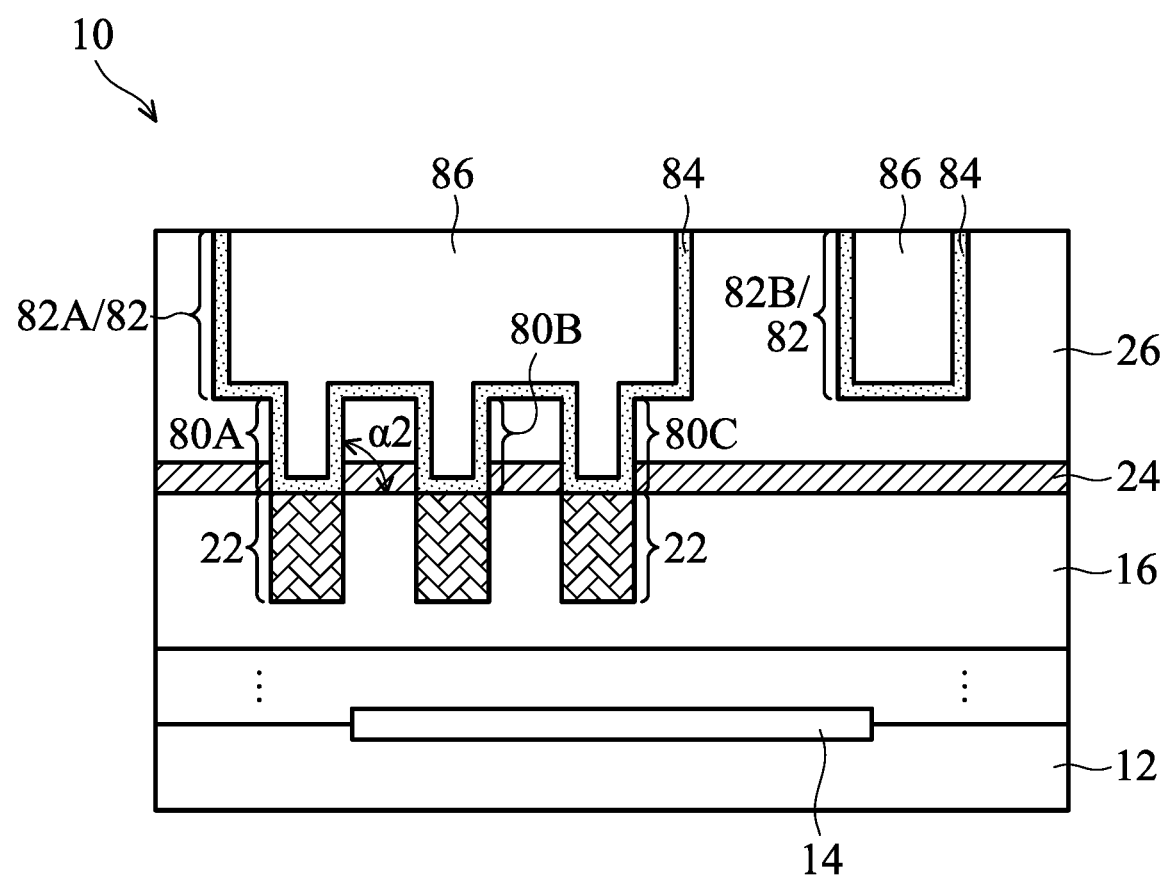

FIG. 16 illustrates the formation of conductive vias 80A, 80B, and 80B (collectively referred to as vias 80) in via openings 52', 60', and 70' (FIG. 15), respectively. Conductive lines 82A and 82B (collectively referred to as 82) are also formed in trenches 72 (FIG. 15). The respective step is shown as step 222 in the process flow shown in FIG. 18. Vias 80 and conductive lines 82 may include conductive liners 84, which may be diffusion barrier layers, adhesion layers, and/or the like. Liners 84 may be formed of titanium, titanium nitride, tantalum, tantalum nitride, or other alternatives. The inner regions 86 of conductive lines 82 and vias 80 include a conductive material such as copper, a copper alloy, silver, gold, tungsten, aluminum, or the like. In accordance with some embodiments, the formation of vias 80 and conductive lines 82 includes performing a blanket deposition to form liner 84, depositing a thin seed layer of copper or copper alloy over the liner, and filling the rest of via openings 52'/60'/70' and trenches 72 with metallic material 86, for example, through electro-plating, electro-less plating, deposition, or the like. A planarization such as Chemical Mechanical Planarization (CMP) is then performed to level the surface of conductive lines 82, and to remove excess conductive materials from the top surface of dielectric layer 26. Layer 28 (FIG. 15) may be removed in the planarization or etched after the planarization. In subsequent steps, an additional dielectric ESL layer (not shown) may be formed, and more low-k dielectric layers, metal lines, and vias (not shown) may be formed over the additional dielectric ESL layer. The process steps and resulting structures may be similar to what are shown in FIGS. 1 through 16.

The process steps shown in FIGS. 1 through 16 illustrate the formation of three vias connected to the same overlying metal line 82A. The same process steps may also be used for forming a plurality of vias, with each connected to one of a plurality of overlying metal lines. The process steps may be performed simultaneously, and share the process steps, as shown in FIGS. 1 through 16, with no additional process steps added.

FIG. 16 illustrates the tilting angle $\alpha 2$ of the sidewalls of vias formed using the multiple-patterning-multiple-etching processes. Tilting angle $\alpha 2$ is influenced by tilting angle $\alpha 1$ in layer 40 (FIG. 9). For example, increasing tilting angle $\alpha 1$ causes the increase in tilting angle $\alpha 2$, and vice versa. Accordingly, adopting the embodiments of the present disclosure has the effect of making the sidewalls of vias to be more vertical.

The embodiments of the present disclosure have some advantageous features. By forming a high-carbon dielectric layer to preserve the patterns of multiple patterning-and-etching processes, the patterns may be transferred to the underlying low-k dielectric layer more accurately than when using a low-carbon dielectric layer. The advantageous feature is due to the high etching selectivity between the high-carbon layer and the underlying LT oxide layer. Furthermore, forming a capping layer over the high-carbon dielectric layer has the advantageous feature of preserving carbon atomic percentage, and hence the etching selectivity does not degrade due to the multiple patterning (and the resulting multiple ashing process). As a result, the uniformity in the lateral sizes of the via openings is improved. For example, experiment results obtained from sample wafers indicated that by forming via openings using the multiple-patterning-multiple-etching process in accordance with embodiments of the present disclosure, via openings 50', 60', and 70' (FIG. 15) have lateral sizes of 52.4 µm, 52.5 µm, and 53.1 µm, respectively, with the fluctuation being within 1.7 µm, 1.1 µm, and 1.5 µm, respectively. These results prove that that the uniformity in the via openings throughout the wafer is high.

In accordance with some embodiments of the present disclosure, a method includes forming a carbon-containing layer with a carbon atomic percentage greater than about 25 percent over a first hard mask layer, forming a capping layer over the carbon-containing layer, forming and patterning a first photo resist over the capping layer, and etching the capping layer and the carbon-containing layer using the first photo resist as a part of a first etching mask. The first photo resist is then removed. A second photo resist is formed and patterned over the capping layer. The capping layer and the carbon-containing layer are etched using the second photo resist as a part of a second etching mask. The second photo resist is removed. A third photo resist under the carbon-containing layer is etched using the carbon-containing layer as a third etching mask. A dielectric layer underlying the third photo resist is etched to form via openings, and the third photo resist is used as a part of a fourth etching mask. The via openings are filled with a conductive material.

In accordance with some embodiments of the present disclosure, a method includes forming a carbon-containing layer over a first hard mask layer, forming a capping layer over the carbon-containing layer, forming and patterning a first photo resist over the capping layer, etching the capping layer and the carbon-containing layer using the first photo resist as a part of a first etching mask, and ashing the first photo resist. After the first photo resist is ashed, the capping layer remains. A photo resist layer is etched to extend an opening in the carbon-containing layer into the photo resist layer. The capping layer is removed during the etching the photo resist layer. The opening in the photo resist layer is further extended into a low-k dielectric layer to form a via opening. The via opening stops at an intermediate level of the low-k dielectric layer. The low-k dielectric layer is then etched using a second hard mask layer over the low-k dielectric layer as an etching mask to form a trench. When the trench is formed, the via opening extends to a bottom of the low-k dielectric layer. The trench and the via opening are filled with a conductive material to from a metal line and a via, respectively.

In accordance with some embodiments of the present disclosure, a method includes forming a first silicon oxide layer, forming a carbon-containing organic layer over the first silicon oxide layer, forming a second silicon oxide layer over the carbon-containing organic layer, performing a first patterning to form a first opening in the second silicon oxide layer and the carbon-containing organic layer, performing a second patterning to forming a second opening in the second silicon oxide layer and the carbon-containing organic layer, using the second silicon oxide layer and the carbon-containing organic layer as a first etching mask to extend the first opening and the second opening into the first silicon oxide layer, and using the first silicon oxide layer as a second etching mask to extend the first opening and the second opening into a photo resist underlying the first silicon oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a carbon-containing layer, wherein the carbon-containing layer is formed of a carbon-containing material;
    forming a capping layer over the carbon-containing layer;
    in a double-patterning process, forming a first opening and a second opening in the capping layer and the carbon-containing layer, wherein each of the first opening and the second opening is formed by steps comprising:
        forming and patterning a first photo resist over the capping layer;
        etching the capping layer and the carbon-containing layer using the first photo resist as a part of a first etching mask; and
        removing the first photo resist;
    patterning a second photo resist underlying the carbon-containing layer using the carbon-containing layer as a second etching mask;
    etching a dielectric layer underlying the second photo resist to extend the first opening and the second opening into the dielectric layer, wherein the second photo resist is used as a third etching mask; and
    filling portions of the first opening and the second opening in the dielectric layer with a conductive material.

2. The method of claim 1, wherein the carbon-containing layer has a carbon atomic percentage higher than about 25 percent.

3. The method of claim 1, wherein the first opening and the second opening extend to a bottom surface of the carbon-containing material.

4. The method of claim 1, wherein in the double-patterning process, the first opening and the second opening stop on an oxide layer underlying and contacting the carbon-containing layer.

5. The method of claim 4, wherein the oxide layer and the capping layer are formed of a same material.

6. The method of claim 4 further comprising, before the dielectric layer is etched, etching the oxide layer to extend the first opening and the second opening into the second photo resist.

7. The method of claim 1, wherein the forming the carbon-containing layer comprises depositing a compound layer comprising carbon compounded with silicon and hydrogen.

8. The method of claim 7, wherein the compound layer further comprises oxygen.

9. A method comprising:
    depositing a carbon-containing layer over a hard mask layer;
    depositing a capping layer over the carbon-containing layer;
    etching the capping layer and the carbon-containing layer to form a first opening;

patterning a photo resist underlying the carbon-containing layer to extend the first opening into the photo resist;

extending the first opening in the photo resist into a dielectric layer to form an opening in the dielectric layer, wherein the opening in the dielectric layer extends to an intermediate level of the dielectric layer;

removing the photo resist to reveal a trench in the hard mask layer;

extending both the trench in the hard mask layer and the opening in the dielectric layer downwardly to a bottom portion of the dielectric layer; and filling the opening in the dielectric layer with a conductive material to from a conductive feature.

10. The method of claim 9 further comprising removing the capping layer when the photo resist is patterned.

11. The method of claim 9, wherein the depositing the carbon-containing layer comprises depositing a carbon-containing dielectric layer having a carbon atomic percentage between about 25 percent and about 35 percent.

12. The method of claim 11, wherein the carbon-containing layer is an organic layer.

13. The method of claim 11, wherein the carbon-containing layer is an inorganic layer.

14. The method of claim 9 further comprising:
etching the capping layer and the carbon-containing layer to form a second opening, wherein the first opening and the second opening are etched in different etching processes.

15. The method of claim 14, wherein the first opening and the second opening formed in the different etching processes stop on a same mask layer, and the same mask layer is used as an etching mask when the first opening is extended into the photo resist.

16. The method of claim 9, wherein the carbon-containing layer has a first carbon atomic percentage, and after the removing the photo resist, the carbon-containing layer has a second carbon atomic percentage substantially equal to the first carbon atomic percentage.

17. A method comprising:
forming a first hard mask layer;
forming a carbon-containing layer over the first hard mask layer;
forming a second hard mask layer over the carbon-containing layer;
performing a first patterning to form a first opening in the second hard mask layer and the carbon-containing layer;
performing a second patterning to forming a second opening in the second hard mask layer and the carbon-containing layer;
using the second hard mask layer and the carbon-containing layer as a first etching mask to simultaneously extend the first opening and the second opening into the first hard mask layer; and
extending the first opening and the second opening in the first hard mask layer into a photo resist.

18. The method of claim 17 further comprising:
transferring the first opening and the second opening into a low-k dielectric layer underlying the photo resist using the photo resist as an etching mask; and
removing the photo resist.

19. The method of claim 18, wherein when the photo resist is removed, the first opening and the second opening stop at an intermediate level of the low-k dielectric layer, and an additional hard mask underlying the photo resist is revealed after the photo resist is removed, and the method further comprises:
etching the low-k dielectric layer using the additional hard mask as an additional etching mask to form a trench, wherein when the trench is formed, the first opening and the second opening extend to a bottom of the low-k dielectric layer.

20. The method of claim 17, wherein the forming the carbon-containing layer comprises depositing a carbon-containing dielectric layer having a carbon atomic percentage between about 25 percent and about 35 percent.

* * * * *